United States Patent
Lu

(10) Patent No.: US 7,024,516 B2
(45) Date of Patent: Apr. 4, 2006

(54) CONFIGURABLE TERNARY CONTENT ADDRESSABLE MEMORY

(75) Inventor: RayChin Lu, Irvine, CA (US)

(73) Assignee: Zarlink Semiconductor Limited, Swindon (GB)

( * ) Notice: Subject to any disclaimer, the term of this patent is extended or adjusted under 35 U.S.C. 154(b) by 420 days.

(21) Appl. No.: 10/403,110

(22) Filed: Mar. 31, 2003

(65) Prior Publication Data

US 2004/0205292 A1    Oct. 14, 2004

(51) Int. Cl.
G06F 12/00 (2006.01)

(52) U.S. Cl. ......................... 711/108; 365/49

(58) Field of Classification Search ................ 711/108; 365/49–50
See application file for complete search history.

(56) References Cited

U.S. PATENT DOCUMENTS

| | | | |
|---|---|---|---|
| 5,259,066 A * | 11/1993 | Schmidt ...................... | 706/50 |
| 6,373,737 B1 * | 4/2002 | Lysinger ..................... | 365/49 |
| 6,373,738 B1 | 4/2002 | Towler et al. | |
| 6,438,674 B1 | 8/2002 | Perloff | |
| 2002/0036912 A1 | 3/2002 | Helwig | |
| 2002/0039303 A1 | 4/2002 | Hayakawa et al. | |
| 2002/0126672 A1 | 9/2002 | Chow et al. | |
| 2004/0083337 A1 * | 4/2004 | Husby ........................ | 711/108 |

* cited by examiner

Primary Examiner—Matthew D. Anderson
(74) Attorney, Agent, or Firm—Lawrence E. Laubscher, Jr.

(57) ABSTRACT

A Ternary/Content Addressable Memory (T/CAM) design is presented. The CAM includes a rule table implemented using a Random Access Module (RAM) storing n rule entries. An n-to-1 multiplexer module, responsive to a value C of a cycle counter, varying between 0 to n-1, provides a selected C'th rule entry to a comparator block which performs a comparison between the selected C'th rule entry and a matching key. The resulting comparison result together with the value C are used to decode the matched rule. In implementing a TCAM, a bitmask table implemented using a RAM module storing n bitmask entries is used. An n-to-1 multiplexer module, responsive to the value C provides a corresponding C'th bitmask to a masking module which modifies the comparison result to ignore a subgroup of results of bitwise comparisons between the C'th rule entry and the matching key. T/CAM implementations adhering to the described embodiment support comparison of the matching key against a number of N masked rules using masked comparison hardware of size m, where m is much smaller than N. Advantages are derived from the provision of a flexible rule-based classification, filtering and verification packets conveyed in accordance with various packet transport protocols at wire-speed in support of VoIP provisioning. The flexibility is especially beneficial in implementing convergent applications.

18 Claims, 3 Drawing Sheets

|  | RAM | | | | | | | | | | | | | | | | |
|---|---|---|---|---|---|---|---|---|---|---|---|---|---|---|---|---|---|
| Rule | 0 | 1 | 2 | 3 | 4 | 5 | 6 | 7 | 8 | 9 | 10 | 11 | 12 | 13 | 14 | 15 | 16 |
| 0 | 0 | 16 | 32 | 48 | 64 | 80 | 96 | 112 | 128 | 144 | 160 | 176 | 192 | 208 | 224 | 240 | 256 |
| 1 | 1 | 17 | 33 | 49 | 65 | 81 | 97 | 113 | 129 | 145 | 161 | 177 | 193 | 209 | 225 | 241 | 257 |
| 2 | 2 | 18 | 34 | 50 | 66 | 82 | 98 | 114 | 130 | 146 | 162 | 178 | 194 | 210 | 226 | 242 | 258 |
| 3 | 3 | 19 | 35 | 51 | 67 | 83 | 99 | 115 | 131 | 147 | 163 | 179 | 195 | 211 | 227 | 243 | 259 |
| 4 | 4 | 20 | 36 | 52 | 68 | 84 | 100 | 116 | 132 | 148 | 164 | 180 | 196 | 212 | 228 | 244 | 260 |
| 5 | 5 | 21 | 37 | 53 | 69 | 85 | 101 | 117 | 133 | 149 | 165 | 181 | 197 | 213 | 229 | 245 | 261 |
| 6 | 6 | 22 | 38 | 54 | 70 | 86 | 102 | 118 | 134 | 150 | 166 | 182 | 198 | 214 | 230 | 246 | 262 |
| 7 | 7 | 23 | 39 | 55 | 71 | 87 | 103 | 119 | 135 | 151 | 167 | 183 | 199 | 215 | 231 | 247 | 263 |
| 8 | 8 | 24 | 40 | 56 | 72 | 88 | 104 | 120 | 136 | 152 | 168 | 184 | 200 | 216 | 232 | 248 | 264 |
| 9 | 9 | 25 | 41 | 57 | 73 | 89 | 105 | 121 | 137 | 153 | 169 | 185 | 201 | 217 | 233 | 249 | 265 |
| 10 | 10 | 26 | 42 | 58 | 74 | 90 | 106 | 122 | 138 | 154 | 170 | 186 | 202 | 218 | 234 | 250 | 266 |
| 11 | 11 | 27 | 43 | 59 | 75 | 91 | 107 | 123 | 139 | 155 | 171 | 187 | 203 | 219 | 235 | 251 | 267 |
| 12 | 12 | 28 | 44 | 60 | 76 | 92 | 108 | 124 | 140 | 156 | 172 | 188 | 204 | 220 | 236 | 252 | 268 |
| 13 | 13 | 29 | 45 | 61 | 77 | 93 | 109 | 125 | 141 | 157 | 173 | 189 | 205 | 221 | 237 | 253 | 269 |
| 14 | 14 | 30 | 46 | 62 | 78 | 94 | 110 | 126 | 142 | 158 | 174 | 190 | 206 | 222 | 238 | 254 | 270 |
| 15 | 15 | 31 | 47 | 63 | 79 | 95 | 111 | 127 | 143 | 159 | 175 | 191 | 207 | 223 | 239 | 255 | 271 |

Virtual CAM

FIG. 5

CONFIGURABLE TERNARY CONTENT ADDRESSABLE MEMORY

FIELD OF THE INVENTION

The invention relates to rule-based data packet classification in hardware, and in particular to configurable wire-speed rule-based classification, filtering, and verification of packets conveyed in accordance with various packet transport protocols.

BACKGROUND OF THE INVENTION

In the field of communications, voice service such as, but not limited to the Plain Old Telephone Service (POTS), audio conferencing, facsimile, video conferencing, etc. are being provisioned over a redundant circuit-switched infrastructure which provides dedicated redundant end-to-end connections. The benefits enjoyed in employing circuit-switched technologies include a high quality-of-service provisioning at a guaranteed bandwidth enabled via the dedicated end-to-end connectivity provided. Circuit-switched technologies suffer from an inefficient use of the available bandwidth and high costs associated with the development, deployment, and maintenance of the redundant circuit-switched infrastructure.

Take for example the provisioning of the ubiquitous POTS service to deliver digitized human voice between end-stations in a circuit-switched communications network known as the Public Switched Telephone Network (PSTN). Human voice is sampled at 8 kHz every 125 µs. Each derived voice sample has 8 bits and thus a 64 kb bandwidth dedicated connection is established end-to-end. However, talking human voice is characterized by variable sound time slots and silent pauses. The activity factor of human voice is 0.4 and therefore 60% of the guaranteed bandwidth reserved for each telephone session, is unused.

Solutions have been proposed and implemented in accordance with which, multiple telephone conversations are multiplexed together over the same transmission medium to take advantage of the 60% unused bandwidth. However, these solutions only have a limited success, as only talking human voice has a 0.4 activity factor; singing human voice, facsimile transmissions, video conferencing, etc. have higher activity factors.

In the field of communications, data services have been provisioned over a packet-switched infrastructure which provides best-effort packetized payload transport. Packetized data payloads are only transmitted when generated. Packets include station addressing information. Communications network nodes constituent of the packet-switched infrastructure, route the packets to the intended destination at run-time. The run-time routing decisions are dependent on the operational status of the packet-switched infrastructure encountered in transit. The run-time routed transport of packetized payloads provides bandwidth utilization efficiencies over an economical packet-switched infrastructure.

Given the above, there is pressure to provision voice services over a packet-switched infrastructure. Intense research and development is currently underway towards this end, with exemplary solutions known as Circuit Emulation Services and Packet-Voice solutions. Voice over Internet Protocol (VoIP) Packet-Voice implementations address the generation/play back of voice sample payloads, voice sample payload encapsulation/decapsulation, etc.

The actual transport of VoIP packets in a packet-switched communications network is handled by the packet-switched infrastructure in accordance with a best-effort transport discipline. The best-effort packet transport reduces the need for the deployment of a fully redundant infrastructure achieving reduced comparative cost, while the run-time routing of packets introduces packet processing delays which reduces the quality-of-service delivered. Solutions are being sought for minimizing the negative effects of induced packet processing delays associated with best-effort packet transport to achieve close to real-time conveyance of VoIP packets.

Whether a packet processing function is implemented in hardware or software is always a difficult design choice. Software packet processing implementations benefit from a relatively easy development, fast deployment, and easy maintenance while introducing an uncertainty in the timeliness of the run-time response provided. Hardware packet processing implementations benefit from certainty in the timeliness of the response provided, while hardware solutions tend to provide very specific solutions to particular problems solved and thus lack generality. Large efforts are being undertaken to achieve real-time packet processing.

At packet-switching communications network nodes in a transport path of a conveyed packet, packet classification, switching, and routing decision-making in packet processing involves using extracted packet header field values as a query key in consulting a look-up table to ultimately determine a corresponding switching/routing response. Servicing such a query in software can be a very involved procedure typically performed over a large number of system clock cycles.

In provisioning high density packet-voice solutions, there is pressure for run-time packet classification, switching and routing packet processing functionality, typically implemented in software executed by a packet-switching network node, to migrate from software implementations to hardware implementations seeking benefit of predefined response times ultimately to be processed in real-time. Real-time packet processing refers to performing functions related to handling a received packet at a network node with a maximum processing delay incurred such that the aggregate rate of out going processed packets at least equals the aggregate rate of incoming packets. This real-time packet processing requirement is referred to as "processing packets at wire-speed", where wire-speed relates to the throughput supported on links connected to a communications network node.

A co-pending commonly assigned U.S. patent application Ser. No. 10/033,498 entitled "Generic Header Parser Providing Support for Data Transport Protocol Independent Packet Voice Solutions" filed on Dec. 27, 2001, and incorporated herein by reference, describes methods and apparatus for configurable packet header field value hardware extraction at wire-speed in real-time minimizing the introduction of packet processing latencies.

Using extracted packet header information, recent prior art hardware assisted solutions, make use of a Content Addressable Memory (CAM) 100, schematically shown in FIG. 1, to implement the look-up table for determining a packet treatment discipline to be used in processing each received packet. Generically packet treatment includes, but is not limited to: packet traffic statistics generation, packet traffic shaping, billing, connection access control enforcement, etc. which control packet routing, packet switching, and packet forwarding.

With respect to the implementation of VoIP solutions, determining packet treatment is dependent on a determination of a context identifier (context ID) associated with each received packet. A context, depending on a particular implementation, may refer to: a single point-to-point telephone connection (an application level concept) provisioned using VoIP technologies, a multipoint-to-multipoint audio/video conference provisioned using VoIP technologies, convergent service wherein a multimedia connection/conference simultaneously conveying audio, video, slide show, ticker data, etc.

As a result of processing of a VoIP packet, at least one interface of the network node is determined, based on the VoIP context, to forward at least the voice sample payload over. Forwarding details and disciplines are beyond the scope of the present description and described elsewhere.

In general the CAM 100 employs a table 110 storing, in its entries 112, matching rule bitmasks to be applied, for bit comparison, against a matching key 114 generated from extracted packet header field values. A comparison operation (120) is implemented in hardware using a comparator 122 for each table entry 112. Extracted packet header field values, such as, but not limited to, VoIP flow identifiers and station addressing information, are bit level compared, in performing the comparison operation 120, with the table entries 112 to determine a matching rule which in a VoIP implementation may includes determining a communication session context ID.

Legacy content addressable memory, employed in data switching or router applications using Internet Protocol (IP) Ethernet packets, is used to compare the matching key 114 to all the entries 112 of the table 110, in parallel, using all comparators 122 for a complete match of every matching key 114 bit. A rule is typically codified in a corresponding rule entry 112 for each provisioned connection. Results 124 of the comparison 120 from each comparator 122 is provided to a rule decoder block 130 which typically provides two outputs. The first output is a match result output 132 which signals whether a matching rule/context ID was found. The second output is a rule identifier/context ID output 134.

A variation of content addressable memory, known as Ternary CAM (TCAM), is presented in FIG. 2. TCAMs 200 are used to implement rule matching wherein each bit of the rule entry 112 has three states: '0', '1' or 'X'. The 'X' bits are not taken into account during comparison. In the exemplary implementation presented, bit masking techniques 240 are used: for each rule entry 112, results 224 of bitwise comparisons 120 from the comparators 222 are provided to a corresponding masking block 242. Masking bitmasks are provided 244 from a bitmask table 250 having bitmask entries 252 corresponding to rule entries 112. Only an unmasked subset of comparison results 246 are provided to the rule decoder block 230.

Processing delays introduced in determining a packet treatment discipline such as, determining a context ID in hardware, are dependent on the implementation of the CAM/TCAM 100/200 itself. The intended goal is to determine the match result 132 and the rule ID/context ID 134 preferably in one comparison clock cycle. Then, to shorten that comparison clock cycle as much as possible for a given hardware implementation to achieve high processing speeds. For these reasons, N comparators 122/222 are used for N rule entries 112. Each rule entry 112, shown in FIG. 1 and FIG. 2, is K bits wide and therefore the comparators 112/222 are K bits wide also. The K×N simultaneous comparisons require a large amount of hardware logic which draws a lot of current to operate at high speeds.

Implementations include CAMs/TCAMs 100/200 custom made for each application. As the number of rule entries 112 in the rule table 110 grows, the use of custom-made CAMs/TCAMs 100/200 becomes very expensive due to a prohibitive large physical size (as CAMs/TCAMs are implemented from electronic components the term "size" used here refers to the number of electronic components) the power consumption also becomes very high.

In accordance with a first typical approach of implementing a CAM/TCAM 100/200, a dedicated custom-made CAM/T-CAM is implemented as a stand-alone integrated circuit or as a stand-alone block integrated circuit sub-block. The necessary electronic components are formed on a silicon substrate of an integrated circuit. The implementation has a fixed number N of rule entries each K bits wide exactly. In accordance with this approach, a new CAM/TCAM chip design is required for each implementation which is a very expensive solution which incurs long time-to-market delays.

In using custom-made CAM/TCAM chips already available on the market, the design of a particular solution has to be adapted to fit the available custom-made CAM/TCAM chip leading either to inefficient solutions and/or high implementation costs if it is at all possible to adapt the solution.

In accordance with a second typical approach to implement the functionality of CAMs/TCAMs, is to use discrete components such as compiled Random Access Memory (RAM) and standard logic cells to build a CAM/TCAM 100/200. The high expense associated with designing custom-made integrated circuit CAMs/TCAMs can be avoided, and to some extent the CAM/TCAM design can be kept comparatively more flexible without incurring long time-to-market delays. However, this second approach can only be applied to small to medium sized CAM/TCAM implementations in order to keep the size practical and small, and the processing speed practical and high for target applications. Employing discrete components in a CAM/TCAM implementation becomes troublesome as signal propagation timing and synchronization become harder and harder to guarantee at high processing speeds as CAM/TCAM sizes increase.

Integrated circuit component level advances in CAM design includes prior art United States Patent Aapplication 2002/0039303 entitled "CAM Cell Circuit Having Design Circuit" which was published on Apr. 4, 2002. Hayakawa et al. describes integrated circuit component level design techniques to connect integrated circuit transistor components in order to reduce the number of the integrated circuit components and therefore the integrated circuit area. A speed-up benefit may be enjoyed in the comparison operation. This proposed solution does not address limitations imposed on the number N of, and the width K of, rule table entries and matching key lengths directly, although compact designs presumably could enable increased numbers of parallel rule entry comparisons to be performed in the same area assuming signal timing synchronization can be maintained.

Another integrated circuit component level advance in CAM design includes prior art United States Patent Application 2002/0036912 entitled "Content Addressable Memory (CAM) for Data Lookup in Data Processing Unit" which was published on Mar. 28, 2002. Helwig describes a transistor-level integrated circuit design reducing the number of comparator output circuit nodes which switch states. Power savings are benefited from when a smaller number of circuit nodes change potentials. This proposed solution does not address limitations imposed on the number N of, and the width K of, rule table entries and matching key lengths directly, although reduced state switching presumably could enable increased numbers of parallel rule entry comparisons to be performed at a lower comparative rate of power consumption.

A further integrated circuit component level advance in CAM design includes prior art U.S. Pat. No. 6,373,738 entitled "Low Power CAM Match Line Circuit" which issued on Apr. 16, 2002 to Towler et al. which addresses potential rise times in circuit node switching states. Towler, describes a clever transistor-level circuit design technique for careful timing control in turning-on and turning-off of the match line. Leakage current is reduced when the match line goes through the turn-on-to-turn-off state transition or from the turn-off-to-turn-on state transistor achieving a reduced power consumption. The proposed solution however is dependent on very tightly controlled timing to be performed within the duration of a comparison clock cycle. This proposed solution does not address limitations imposed on the number N of, and the width K of, rule table entries and matching key lengths directly, although reducing leakage currents presumably could enable a larger number of parallel rule entry comparisons to be performed at a lower comparative rate of power consumption. It is not clear whether a speed-up can also be enjoyed given the tight timing control.

A further integrated circuit component level advance in CAM design includes prior art U.S. Pat. No. 6,438,674 entitled "Hash CAM Having Reduced Size Memory Array and its Application" which issued on Aug. 20, 2002 to Perloff. Perloff describes an innovative hash algorithm used to enable larger matching key and rule entry bit widths to be compared using a CAM having a reduced comparative size to what necessarily would otherwise be needed. In implementing the proposed solution, the rule entries 112 and the matching key 114 must be such that a hash function for which the n-bit index for each 2^n m-bit inputs having m-n common bits is always unique. This proposed solution does address limitations imposed on the number of, and the width of, rule table entries and matching key lengths directly, however the proposed solution only provides advantages if the packet header field values have a particular structure.

Yet another prior art United States Patent Application 2002/0126672 is entitled "Method and Apparatus for a Flexible and Reconfigurable Packet Classifier using Content Addressable Memory" which was published on Sep. 12, 2002. Chow et al. describe a 'Reconfigurable Buffet Selector/Parser' circuit used to dynamically form rules by removing the fields not required for comparison prior to storing rules in rule entries 112. Discarding field values, reduces the necessary width of rule entries 112 to reduce size and cost. This proposed solution does address limitations imposed on the number N of, and the width K of, rule table entries and matching key lengths directly, however the proposed solution requires additional hardware logic to implement the field value filtering in real time while incurring a corresponding development cost. The proposed solution may provide benefits in an environment where a large number of changes to the rule table are necessary at run-time per packet throughput expected to be supported. The additional hardware logic increases both the number of components and latency as the rule determination, rule writing, and comparison need to be performed sequentially.

There therefore is a need to solve the above mentioned issues.

SUMMARY OF THE INVENTION

In accordance with an aspect of the invention, a Content Addressable Memory (CAM) design is presented. The CAM includes a rule table implemented using a Random Access Module (RAM) storing n rule entries. An n-to-1 multiplexer module, responsive to a value C of a cycle counter, varying between 0 to n-1, provides a selected C'th rule entry to a comparator block which performs a comparison between the selected C'th rule entry and a matching key. The resulting comparison result together with the value C are used to decode the matched rule.

In accordance with another aspect of the invention, a Ternary CAM (TCAM) design is presented. The TCAM further includes a bitmask table implemented using a RAM module storing n bitmask entries is used. An n-to-1 multiplexer module, responsive to the value C provides a corresponding C'th bitmask to a masking module which modifies the comparison result to ignore a subgroup of results of bitwise comparisons between the C'th rule entry and the matching key.

In accordance with yet another aspect of the invention, a method is provided for matching a matching key against N rule entries. A value C of a cycle counter varying between 0 and n-1 is incremented. The value C resets to zero when incremented by one count while holding a value of n-1. A C'th rule entry in each of m rule Random Access Module (RAM) blocks is selected, where N=n*m. The matching key is compared against the m selected rule entries using m comparators in parallel. A matched rule entry is selectively determined based on m comparison results provided by the m comparators and the value C. A matched result signal and an identification of the matched rule entry is selectively provided based on the comparison results. The method is repeated until a matching rule is found or the value C is reset to zero.

The configurable T/CAM greatly reduces the size of the comparison hardware, in terms of the number m of comparators and corresponding masking modules, used to support matching a matching key against N rule entries, with a worst case of n comparison cycle delay being incurred to complete the rule table search, where N=n*m.

The advantages are derived from the provision of a flexible rule-based classification, filtering and verification packets conveyed in accordance with various packet transport protocols at wire-speed in support of VoIP provisioning. The flexibility is especially beneficial in implementing convergent applications.

BRIEF DESCRIPTION OF THE DRAWINGS

The features and advantages of the invention will become more apparent from the following detailed description of the preferred embodiment(s) with reference to the attached diagrams wherein:

FIG. 5 is a table specifying rule identifiers associated with rules stored in a group of Random Access Memory (RAM) modules in accordance with the exemplary embodiment of the invention.

It will be noted that in the attached diagrams like features bear similar labels.

DETAILED DESCRIPTION OF THE EMBODIMENTS

Figure 3:
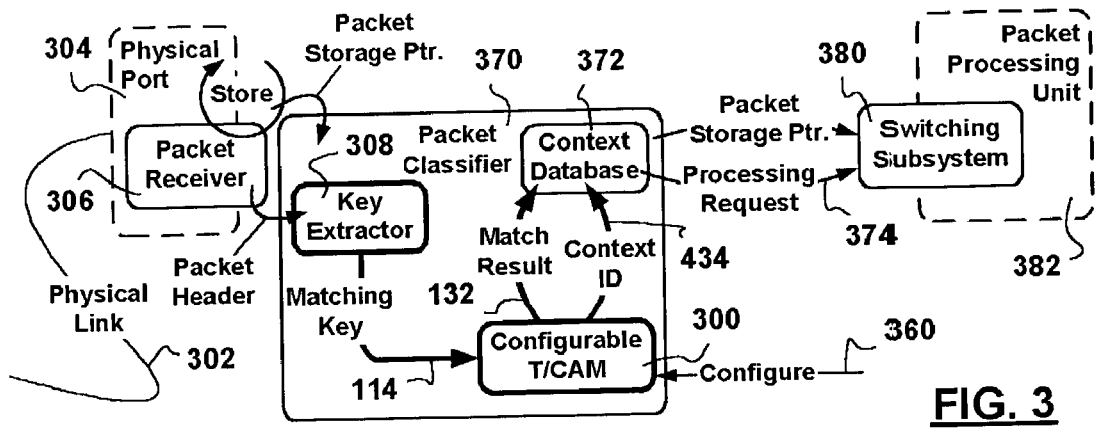
FIG. 3 is a schematic diagram showing high level VoIP packet processing in accordance with an exemplary embodiment of the invention.

In using CAM-based hardware look-up techniques to implement VoIP applications, a new rule may be created at most for each provisioned VoIP connection and added to the rule table. In accordance with an exemplary embodiment of the invention shown in FIG. 3 and FIG. 4, a central processing unit (not shown), associated with the packet processing unit 382, populates (360) rule entries 112 in the modified rule table 410 of a configurable T/CAM 300.

Upon receiving a VoIP packet conveyed over a physical link 302, the VoIP packet (at least its voice payload) is stored pending processing and at least the first 96 bytes of the received VoIP packet are provided to a packet classifier 370 to extract a matching key 114 therefrom. A packet storage address pointer is also provided to the packet classifier 370. The invention is not limited to making use of the first 96 bytes of VoIP packet header data to extract the matching key 114, certainly a different number of bytes may be provided to the packet classifier 370. VoIP packet headers have a varied length dependent on the stack of protocols used in provisioning VoIP services. Protocol staking examples include, and are not limited to: IP over Ethernet, UDP over IP over Ethernet, etc.

A key extractor 308 generates a matching key 114 corresponding to the received VoIP packet. The packet classifier 370, and therefore the key extractor 308, may be associated with a packet receiver 306 of a single physical port 304 or a group of packet receivers 306 without limiting the invention.

In accordance with the exemplary embodiment of the invention, the matching key 114 is generated in accordance with the protocol stacking type specified in control packets previously received during the VoIP connection set-up, thereby eliminating the need for a hardware packet parser and maintaining implementation flexibility. The extracted matching key 114 is provided to the configurable T/CAM 300. The operation of the configurable T/CAM 300 will be described herein below.

Depending on implementation, the determined context ID 434 and the positive match result 132 are used to query a context database 372, or the like, to determine the processing treatment discipline necessary for the VoIP packet. The positive match result 132 may be used as a trigger signal to the context database 370 to perform the query in processing the received VoIP packet. The ensuing VoIP packet treatment may include, but is not limited to, a packet processing request 374 sent to a switching subsystem 380 associated with a packet processing unit 382. The packet storage address pointer may also be provided to the packet processing unit 382. Packet processing is beyond the present description.

In supporting a large number of active contexts, the combined necessary size of comparator and masking circuit (also referred to as matching hardware) can be beyond the reach of an economical implementation.

In accordance with the exemplary embodiment of the invention, hardware TCAM based solutions are sought because of the provision of configurable rule matching easily implemented via the use of masking techniques by ignoring comparison output bits. Any combination of bits in a specific rule entry 112 can be used for matching purposes by programming the associated bitmask entry 252. This very flexible and powerful feature is beneficial in VoIP packet classifier 370 implementations, where different types of protocol stackings supported concomitantly, require the packet classifier 370 to consider values from different packet header fields in determining a VoIP packet treatment discipline.

Figure 1:
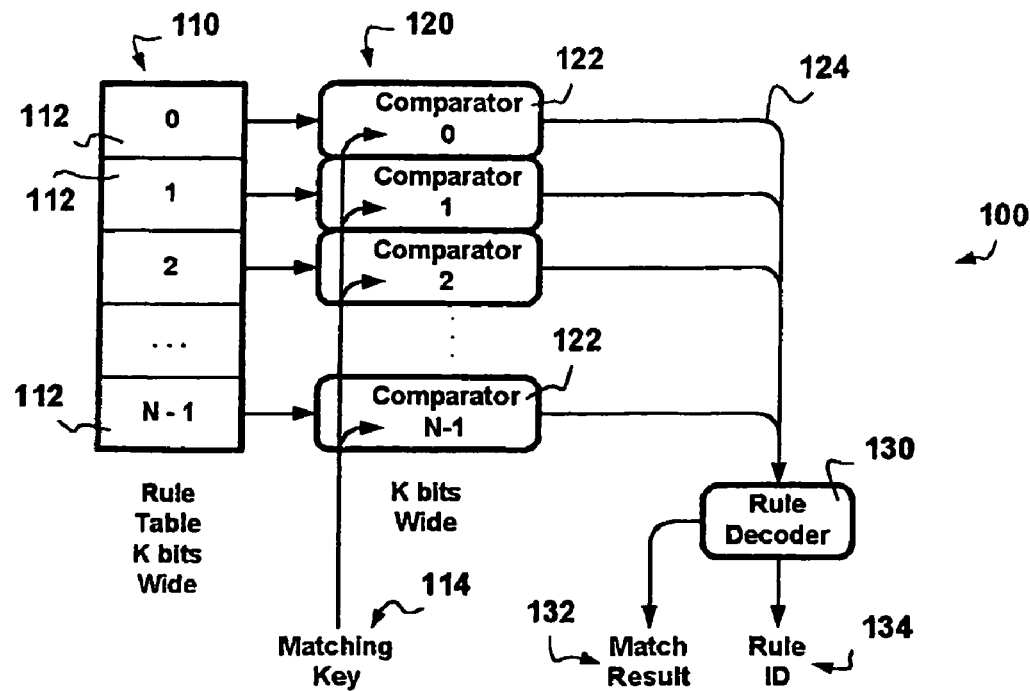
FIG. 1 is a schematic diagram showing elements implementing a content addressable memory module.
Figure 2:
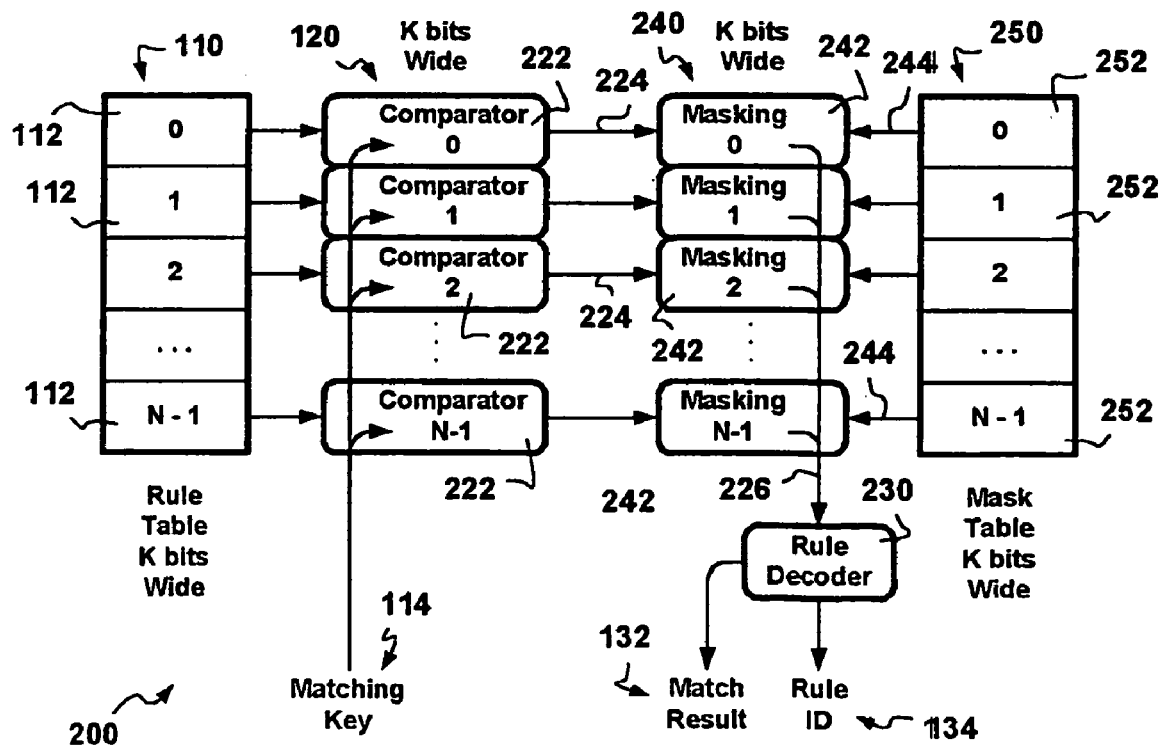
FIG. 2 is a schematic diagram showing elements implementing a ternary content addressable memory module.

It is perhaps important, at this point in the description, to reiterate that in using a prior art CAM implementation techniques, N comparators (122/222) and N corresponding masking functions (242) are required for N rules (rule entries 112) as shown in FIG. 2.

In accordance with the exemplary embodiment of the invention, N and m (both integers) are chosen to satisfy: $n=(2^b)$, where b is a positive integer, and $N=m*n$ where $m<N$. Therefore for N rules (rule entries 112) and N bitmasks (bitmasks entries 252), only m comparators (222) and m corresponding masking functions (242) are required as shown in FIG. 4.

Figure 4:
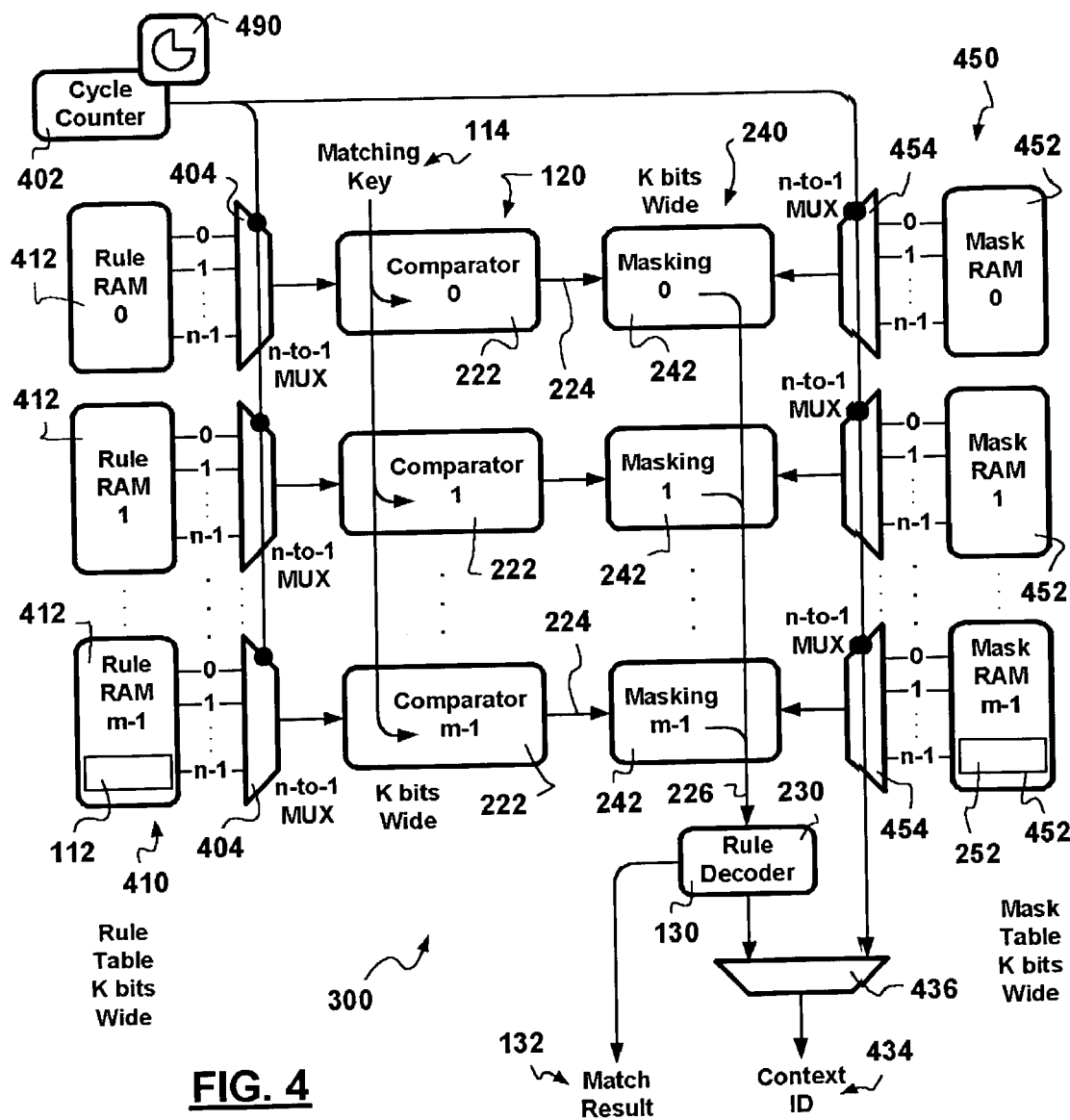
FIG. 4 is a schematic diagram showing elements implementing a configurable TCAM in accordance with the exemplary embodiment of the invention.

In accordance with the exemplary embodiment of the invention, the following exemplary rule matching process is followed using the exemplary TCAM implementation shown in FIG. 4:

N rules are stored into m RAM modules 412: RAM(0) to RAM(m-1) storing n rule entries 112 each: rule entry 0 to n-1 in RAM(0), rule entry n to 2n-1 in RAM (1), etc.

On every matching cycle "C" of a cycle counter 402, where C varies from 0 to n-1, corresponding rule entry 112 address "C" locations in each RAM module 412 of the rule table 410, and corresponding masking table entry 252 address "C" locations in each RAM module 452 are used for comparison against the matching key 114.

m rules are compared simultaneously since one rule entry 112 from every RAM module 412 is compared in the same comparison clock cycle "C". Therefore each group of "matching cycle C labeled" m rules and the corresponding group of m maskable comparators (222/242/252) define a "virtual CAM". There are n such virtual CAMs.

If no match is found in a currently "C-selected" virtual CAM, the value C of the cycle counter 402 is incremented and the match is attempted again.

If a match is found, the address of the matching rule entry 112 of the current virtual CAM is decoded, 0 to m-1, and used together with the value C of the cycle counter 402, 0 to n-1, to determine the complete overall address of the matched rule entry 112, 0 to N-1, corresponding to the packet's context ID 434.

The following example relates to a particular implementation for which matching rule table is presented in FIG. 5. The rule table 410 has 272 rule entries 112, numbered from 0 to 271: N=272, m=17 and n=16 (272=17×16). The 272 rules are therefore stored in 17 RAM modules 412, RAM(0) through RAM(16), each RAM module 412 having 16 rule entries 112 corresponding to 16 virtual TCAMs. Each row in the table corresponds to a virtual TCAM and the rules specified in each column are associated with a RAM module 412. The cycle counter C can exemplary be implemented using a 4 bit register.

Assume "Rule 210" is the rule that matches the matching key 114:

(1). Cycle 0 (C=0)

Virtual TCAM(0), performs comparisons between the matching key 114 and rules 0, 16, 32, 48, 64, 80, 96, 112, 128, 144, 160, 176, 192, 208, 224, 240, 256.

The virtual TCAM(0) parallel comparisons do not yield a match.

Increment C. The value C of the cycle counter 402 is incremented by a clock signal provided by a clock 490. Clock 490 may be a system clock associated with the communication network node implementing the exemplary embodiment of the invention, or a T/CAM dedicated clock.

(2). Cycle 1 (C=1)

Virtual TCAM(1), performs comparisons between the matching key 114 and rules 1, 17, 33, 49, 65, 81, 97, 113, 129, 145, 161, 177, 193, 209, 225, 241, 257.

The virtual TCAM(1) parallel comparisons do not yield a match.

Increment C again.

(3). Cycle 2 (C=2)

Virtual TCAM(2), performs comparisons between the matching key 114 and rules 2, 18, 34, 50, 66, 82, 98, 114, 130, 146, 162, 178, 194, "210", 226, 242, 258.

The virtual TCAM(2) parallel comparisons yield a match. The search stops.

(4). The matched rule address "210", which has a nine bit binary representation 9'b011010010, is derived from rule entry address RAM(2) and the value of C: where rule entry address 13=5'b01101 and C=4'b0010. In accordance with the exemplary embodiment of the invention, the rule decoder 230 has a simple implementation, decoding the address of the first matched rule entry 112, 0 to m-1, for example, into a binary number.

(5). The value of C is reset to zero. Resetting the value of C to zero or a roll over of the value of C to zero being used to select and load a subsequent matching key corresponding to a subsequent packet to be processed.

In accordance with an exemplary implementation of the exemplary embodiment of the invention, each matching key 114 may be compared to all N rule entries 112 which would always require n comparison clock cycles of the cycle counter 402. Such implementations may, for example, require a best rule match not just a first match, and a maximum fixed processing delay of n comparison cycles is incurred. Because a fixed processing delay of n comparison cycles is incurred, the ordering of the rules specified in the rule entries 112 is not important providing flexibility in loading the rule entries 112 of the RAM modules 412 with rule specifications in configuring 360 the T/CAM 300.

In accordance with another exemplary implementation of the exemplary embodiment of the invention, each matching key 114 is compared by successive virtual CAMs until a first match is found at which point further matching is aborted. A variable processing delay is therefore incurred but the variable processing delay corresponds to a maximum of n comparison cycles. If a best match solution is sought in such a particular implementation, then the ordering of the rules becomes important in configuring 360 the T/CAM 300.

Implementations adhering to the exemplary embodiment of the invention benefit from implementation size reductions because N rules are compared using a total of n virtual T/CAMs where n<N.

While, desirably, the size of the matching hardware is reduced in comparison with the size N of the rule table 410 by the use of n-to-1 multiplexers 404 and 454 employed to select rule 112 and masking bitmap 252 entries of a virtual T/CAM respectively. In accordance with the exemplary embodiment of the invention, the use of the multiplexers 404/454 decouples the size m of the matching hardware from the size N of the rule table 410 providing great flexibility in designing configurable T/CAMs.

The reduction in the size of the matching hardware, including the comparators 222 and masking modules 242, reduces power consumption, reduces heat dissipation, and enables tighter signal timing. The tighter signal timing benefit enhances VoIP packet processing throughput in support of convergent applications provisioning large numbers of simultaneous connections.

In accordance with the exemplary embodiment of the invention, the configurable T/CAM implementation provides support for packet treatment determination to be performed real-time, in support of VoIP applications, by selecting the number of virtual T/CAMs to ensure VoIP packet processing at wire-speed.

The configurable T/CAM presented herein may therefore be implemented using readily available (standard integrated circuit) components including compiled RAMs for the rule 410 and masking 450 tables, and standard cells for the multiplexers 404/454 without making recourse to transistor-level circuit design nor to the use of expensive custom-made TCAM for each application.

The T/CAM design presented herein is configurable to fit a target application. The number of rules N is selected by selecting appropriate sized RAM modules 412/452. The response time is selected by selecting the size m of the comparison hardware 222/242 and corresponding multiplexers 404/454. Rule bit lengths can be selected as a subcombination of the bit width K of the RAM modules 412/452. Bit masking techniques may be used to implement rule bit lengths less than K.

The embodiments presented are exemplary only and persons skilled in the art would appreciate that variations to the above described embodiments may be made without departing from the spirit of the invention. The scope of the invention is solely defined by the appended claims.

I claim:

1. A Content Addressable Memory (CAM) module comprising:
    a. a rule Random Access Memory (RAM) block storing n rule entries where n=(2^b) and b is a positive integer;
    b. a rule n-to-1 multiplexer responsive to a value C varying between 0 and n-1, the rule multiplexer selecting a C'th stored rule entry in the rule RAM block;
    c. a comparator performing a bitwise matching operation between a matching key and contents of the C'th entry in the rule RAM block provided by the multiplexer, the comparator providing a comparison result;
    d. a rule decoder block responsive to the comparison result and the value C to identify a matched entry, the rule multiplexer and the rule decoder block enabling comparison between the matching key and n rules using a single comparator; and
    e. a comparison binary cycle counter register having b bits, the binary cycle counter register resetting to zero when incremented by one count from an n-1 value.

2. The CAM as claimed in claim 1, further comprising:
    a. a mask Random Access Memory (RAM) block storing n masking bitmask entries;
    b. a mask n-to-1 multiplexer responsive to the value C, the mask multiplexer selecting a C'th stored rule entry in the mask RAM block;
    c. a masking module performing a bitwise masking operation on the comparison result based on contents of the C'th entry in the mask RAM block provided by the mask multiplexer, the mask multiplexer providing to the rule decoder block with unmasked bits of the comparison result, masking bits of the comparison result supporting rule matching against rule entries having different configurations of valid bits.

3. The CAM as claimed in claim 1, further comprising a clock providing a clock signal used to increment the binary cycle counter register to vary the value C between 0 and n-1.

4. A packet classifier comprising the CAM claimed in claim 1.

5. A packet processing engine comprising the CAM claimed in claim 1.

6. A packet classifier comprising the CAM claimed in claim 2.

7. A packet processing engine comprising the CAM claimed in claim 2.

8. A Content Addressable Memory (CAM) module comprising:
   a. m rule Random Access Memory (RAM) blocks each storing n rule entries where n=(2^b) and b is a positive integer;
   b. m rule n-to-1 multiplexers responsive to a value C varying between 0 and n-1, each rule multiplexer selecting a C'th stored rule entry in the corresponding rule RAM block;
   c. m comparators each performing a bitwise matching operation between a single matching key and contents of the C'th entry in the corresponding rule RAM block provided by the corresponding multiplexer, each comparator providing a comparison result;
   d. a single rule decoder block responsive to the m comparison results and the value C to identify a matched entry, the m rule multiplexers and the single rule decoder block enabling comparison between the single matching key and N=n*m rules using m comparator; and
   e. a comparison binary cycle counter register having b bits, the binary cycle counter register resetting to zero when incremented by one count from an n-1 value.

9. The CAM as claimed in claim 8, further comprising:
   a. m mask Random Access Memory (RAM) blocks each storing n masking bitmask entries;
   b. m mask n-to-1 multiplexers responsive to the value C, each mask multiplexer selecting a C'th stored rule entry in the corresponding mask RAM block;
   c. m masking modules, each masking module performing a bitwise masking operation on the comparison result provided by the corresponding comparator, based on contents of the C'th entry in the corresponding mask RAM block provided by the corresponding mask multiplexer, the mask multiplexer providing to the single rule decoder block with unmasked bits of the comparison result, masking bits of the comparison result supporting rule matching against rule entries having different configurations of valid bits.

10. The CAM as claimed in claim 8, further comprising a clock providing a clock signal used to increment the binary cycle counter register to vary the value C between 0 and n-1.

11. A packet classifier comprising the CAM claimed in claim 8.

12. A packet processing engine comprising the CAM claimed in claim 8.

13. A packet classifier comprising the CAM claimed in claim 9.

14. A packet processing engine comprising the CAM claimed in claim 9.

15. A method of matching a matching key against N matching rules comprising cyclical steps of:
   a. incrementing a value C of a cycle counter varying between 0 and n-1, the value C being reset to zero when incremented by one count while holding a value of n-1;
   b. selecting a C'th rule entry in each of m rule Random Access Module (RAM) blocks, where N=n*m;
   c. comparing a matching key against the m selected rule entries using m comparators in parallel;
   d. selectively determining a matched rule entry based on m comparison results provided by the m comparators and the value C; and
   e. selectively providing a matched result signal and an identification of the matched rule entry based on the comparison results.

16. The method claimed in claim 15, further comprising a step of: selectively masking bits of each comparison result employing a C'th mask stored in a mask entry selected from a corresponding one of m mask RAM blocks; the rule decoder being provided with unmasked bits of each comparison result.

17. The method claimed in claim 15, further comprising a step of aborting further comparisons once a match was found and resetting the value of C to zero.

18. The method claimed in claim 17, further comprising a step of: loading a subsequent matching key on resetting the value of C to zero.

* * * * *